Jan. 23, 1968 J. H. MARTIN 3,365,536

CIRCUIT MODULE

Filed Nov. 10, 1965

United States Patent Office 3,365,536
Patented Jan. 23, 1968

3,365,536

CIRCUIT MODULE

Jacob H. Martin, Williamstown, Mass., assignor to Sprague Electric Company, North Adams, Mass., a corporation of Massachusetts Filed Nov. 10, 1965, Ser. No. 507,146
5 Claims. (Cl. 174—52)

ABSTRACT OF THE DISCLOSURE

An insulating wafer having leads in indentations along its edge is sandwiched between substrates which support circuit elements and terminals therefor, wherein the terminals are aligned with the indentations and electrically connected to the leads.

This invention relates generally to a circuit module, and more particularly to a combination of electronic elements sandwiched between insulators capable of high thermal dissipation.

The packaging of microcircuit elements requires the interconnection of exceedingly small components within a unit of minimum bulk so as to provide satisfactory mechanical protection for the components as well as electrical connection to other portions of the circuit.

In general, such packaging has been provided in the prior art by the encapsulation of elements within an insulative potting material. This prior art method, however, normally provides a module having low thermal dissipation capability.

It is an object of this invention to provide an economical circuit module having high thermal dissipation capability and high lead strength.

It is a further object of this invention to provide a circuit package which may be vertically or horizontally interconnected to similar packages and other circuit elements.

These and other objects of this invention will become more apparent upon consideration of the folowing description taken together with the accompanying drawing, in which.

In its broadest scope the present invention comprises a wafer of insulating material overlying a circuit bearing substrate, and having extended leads in connection to said circuit within indentations along the edge of said wafer.

Briefly the process for constructing a circuit module in accordance with this invention includes the step of forming indentations along at least one edge of an insulating wafer, forming at least one circuit element on a substrate, covering said circuit element with said wafer, and fastening leads within said indentations in electrical connection to portions of said circuit element adjoining said indentations.

In a more limited sense the process for constructing a circuit module in accordance with this invention includes the steps of forming indentations along opposing edges of a substantially flat rectangular wafer, forming interconnected circuit elements on each of two substantially flat rectangular substrates, soldering leads to said wafer within said indentations, sandwiching said wafer between said substrates with said elements adjacent thereto, and soldering said leads to said elements adjoining said indentations.

In a more limited sense, a circuit module constructed in accordance with the invention comprises a substantially flat rectangular wafer of insulating material having indentations along opposing edges, said wafer sandwiched between two substrates each having circuit elements thereon adjacent said wafer, said elements extended to the edges of said substrate adjacent said indentations, a fusible conductive material within said indentations and on said elements, and a plurality of leads in connection to said fusible material within said indentation and extending therefrom.

Figures 1, 2:
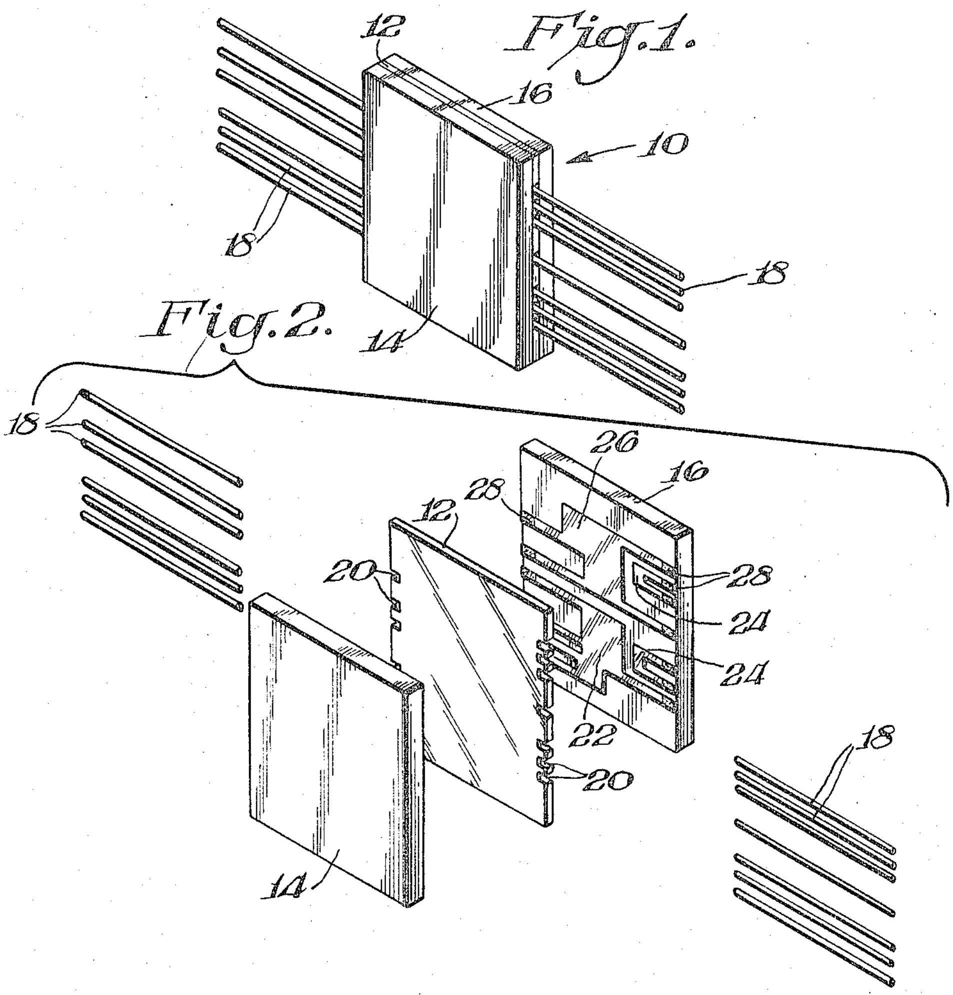
FIGURE 1 is a perspective view of a circuit module provided in accordance with this invention.
FIGURE 2 is an exploded view in perspective of a thin film circuit module.

Referring now to the drawing and in particular to FIGURES 1 and 2, wherein a circuit unit or module 10 is shown including an intermediate wafer 12 sandwiched between two circuit substrates 14, 16 with leads 18 extended from opposing edges.

Wafer 12, which is preferably a thin rectangular sheet of insulating material having high thermal conductivity such as alumina or beryllia or the like, has a number of cuts or indentations 20 along its opposing edges into which metal leads 18, such as nickel or the like, may be inserted. The indentations 20 are made close fitting to leads 18 to correctly position them over the circuit and insulate them from each other. The indenations 20 may be cut in wafer 12 by grinding or the like, or may be molded in place during the initial preparation of the wafer material.

The substrates 14, 16 which are similar in shape to wafer 12, are also formed of insulating material having high thermal conductivity such as alumina or the like. Each substrate 14, 16 carries thin film circuit elements on its surface adacent wafer 12, as illustrated by elements 22, 24, 26 on wafer 16. Various components such as resistors, capacitors, inductors or combinations of these, may be provided on or within the substrates 14, 16 by, for example, thin film techniques.

The components 22, 24, 26, which are interconnected to provide a particular circuit branch, extend to solder bearing terminals 28 adjacent the wafer indentations 20. Such terminals 28 may be merely a low resistance extension of the elements 22, 24, 26 or may be separate solder pads.

In either case, an element conductor 28 is provided adjacent indentations 20 to allow connection of leads 18. The package is completed by inserting the leads in notches 20, sandwiching the wafer 12 between substrates 14, 16 and connecting leads 18 to the adjacent conductive terminals 28. For example, solder or some other fusible conductive material may be provided on pads 28 prior to assembly so that heating of the structure will provide the desired connection.

In the preferred embodiment, leads 18 are also bonded to intermediate wafer 12 to provide exceptional lead strength. Thus, the indentations 20 are metallized with, for example, platinum, gold or silver, and leads 18 are then soldered within indentations 20 before or during completion of the package.

The connection of leads 18 to both wafer 12 and terminals 28 secures both substrates 14, 16 to wafer 12, thereby providing a single module, which may be utilized separately or connected to similar modules or other circuit devices.

Various numbers of substrates and wafers may also be utilized, as indicated above, to provide more complex circuits. Thus a single package having one substrate 14 and one overlying wafer 12 may be employed or any number of alternate wafers and substrates may be vertically stacked with one overlying the other.

In each case, circuit elements are carried on the substrate surface adjacent each wafer. Thus, the first and last substrate of each stack has circuit elements on only one surface whereas the remaining substrates may have elements on both sides adjacent the wafers.

As indicated in the preferred embodiment, substrates 14, 16 are fastened to wafer 12 since leads 18 are bonded to the wafer as well as to terminals 28, however, in some instances only the connections to terminals 28 are required. Thus, if one lead at each opposing edge of the package is connected to adjacent terminals 28 of both substrates 14, 16, the wafer will be secured between them.

Accordingly, dual connection of particular leads can be realized by providing dummy terminals on either or both substrates. In addition, in many circuit configurations it is also desirable to electrically connect the elements of one substrate to those of the other, in which case dummy terminals need not be provided.

In the preferred embodiment, wafer 12 is made thinner than the diameter of leads 18 so that each substrate 14, 16 contacts the leads. Thus, when connection of a particular lead is desired to only one substrate, a blank portion or a dummy terminal 28 is provided on the other substrate adjacent that lead. Similarly, electrical interconnection between the substrates 14, 16 is realized by providing appropriate active terminals 28, on each, adjacent the same wafer indentation. This provides an economical method of interconnecting the circuit of one substrate to a second; and permits crossovers within the module, since conductive elements on the wafer may be employed to perform this function.

Figure 3:
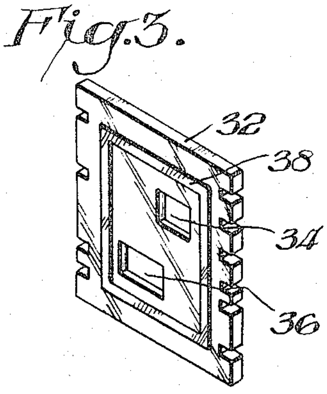
FIGURE 3 is a perspective view of an intermediate wafer modified to accommodate hybrid circuit elements and permit hermetic sealing of the module.

Hybrid circuits may also be packaged in accordance with the invention by providing openings in the intermediate wafer, as shown in FIGURE 3. Thus, openings 34, 36 in wafer 32 allow room for the inclusion of other than thin film elements and may also be utilized as a jig to position the discrete component in the correct position over the substrate.

A further modification, which can be utilized with any of the described embodiments, is also illustrated in FIGURE 3 wherein a sealing ring or rectangle 38 is shown overlying the flat surface of wafer 32. Metallizing such as platinum or gold or the like is applied on both sides of wafer 32 inside the castellated edge as shown. A similar rectangle is applied to each substrate, not shown, over a thin insulating layer of glass or the like, and the module hermetically sealed by fusing or soldering the rectangular rings 38 to those of each substrate 14, 16. The substrate insulating layer is required, of course, to prevent shorting of the elements. Any suitable fusible material, such as a solder or brazing material, may be employed for sealing the unit. In addition, low temperature glass rings may also be utilized, in which case insulation of the substrate circuit is not required.

As indicated, the wafer 32 illustrated in FIGURE 3 is provided with suitable openings 34, 36 for hybrid circuit use. Now, in order to provide a satisfactory hybrid circuit package, the thickness of wafer 32 must of course be equal to, or thicker than, that of the discrete components. In some cases, the thickness would prevent the indicated dual connection of leads, and may require the use of indentations as illustrated in FIGURE 4.

In the latter figure, a thick wafer 42 is shown having indentations 44, 46 on opposed planar surfaces as well as opposed edges. Thus the edge indentations 44, 46 do not penetrate the full thickness of wafer 42, as in the preferred embodiment. In this way, leads may be provided for each substrate circuit while components of reasonable thickness are accommodated. Edge clips may be employed to electrically connect substrates, or the described leads connected externally.

Figure 4:
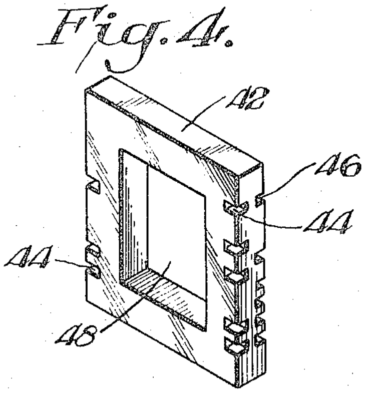
FIGURE 4 is a perspective view of an intermediate wafer illustrating a further modification.

FIGURE 4 also illustrates a further modification of the intermediate wafer in that a large open section 48 is provided rather than the small openings described above. This permits a wide variety of components to be employed but does not, of course, generally provide jigging for components.

A hybrid circuit module may also be constructed with a single substrate and wafer by providing a pocket within the wafer. Thus, the openings 34, 36 of FIGURE 3 need not penetrate through the full thickness of the wafer. Indentations, which penetrate the full thickness of the wafer, may then be utilized for perpendicular as well as parallel lead egress.

The described embodiments are economical to construct, and provide high thermal dissipation since potting materials, which have generally low thermal conductivity, are avoided. The use of aluminum oxide or beryllium oxide, for example, will provide a package having excellent thermal dissipation capabilities. Accordingly, a heat sink may be attached to either substrate, or the package may be affixed directly to the circuit chassis. In a similar manner, the heat sink may be affixed to both the wafer and the substrate, or either, in those embodiments which utilize a single substrate.

Lead strength, although somewhat higher when leads are also bonded to the wafer, is quite satisfactory in all embodiments, and in addition, each lead is insulated from each other and the lead connection well protected.

Various modifications are of course possible. Thus, although rectangular insulators were described other shapes, such as circular or triangular, may also be useful, and various insulating material may be employed. Thus many different embodiments of this invention may be made without departing from the spirit and scope hereof and it should be understood that the invention is not to be limited except as defined in the appended claims.

What is claimed is:

1. A circuit module comprising a wafer of insulating material having indentations along at least one edge thereof, said wafer being sandwiched between substrates each having terminals for circuit elements on the surface adjacent said wafer, said terminals being aligned with selected ones of said indentations, a lead in each said selected indentations being electrically connected with an aligned terminal by fusible material.

2. A circuit module as claimed in claim 1 wherein said indentations are metallized and said leads are affixed to said wafer within said indentations by said fusible material.

3. A circuit module as claimed in claim 1 wherein said wafer and said substrates are substantially rectangular plates having high thermal conductivity.

4. A circuit module as claimed in claim 3 wherein said substrates are aluminum oxide.

5. A circuit module as claimed in claim 3 wherein said substrates are beryllium oxide.

References Cited

UNITED STATES PATENTS 2,849,583 8/1958 Pritikin.
3,265,806 8/1966 Burks et al. ---------- 174—52

DARRELL L. CLAY, *Primary Examiner.*